United States Patent
Mi

(10) Patent No.: US 9,116,589 B2
(45) Date of Patent: *Aug. 25, 2015

(54) SINGLE-LAYER PROJECTED CAPACITIVE TOUCH PANEL AND METHOD OF MANUFACTURING THE SAME

(71) Applicant: TPK Touch Solutions Inc., Taipei (TW)

(72) Inventor: David Mi, Taoyuan (TW)

(73) Assignee: TPK Touch Solutions Inc., Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/177,226

(22) Filed: Feb. 11, 2014

(65) Prior Publication Data

US 2014/0152920 A1 Jun. 5, 2014

Related U.S. Application Data

(63) Continuation of application No. 12/661,787, filed on Mar. 24, 2010, now Pat. No. 8,686,965.

(30) Foreign Application Priority Data

Jan. 26, 2010 (TW) .............................. 99102092 A

(51) Int. Cl.
G06F 3/044 (2006.01)
H05K 3/30 (2006.01)

(52) U.S. Cl.
CPC ....... *G06F 3/044* (2013.01); *H05K 3/30* (2013.01); Y10T 29/49105 (2015.01)

(58) Field of Classification Search
CPC .............. G06F 3/041; G06F 3/044; G06F 2203/04103; G06F 2203/04111; G06F 2203/04112; H03K 17/955; H03K 17/962
USPC .......... 345/173–178; 178/18.01–18.09, 18.11
See application file for complete search history.

(56) References Cited

U.S. PATENT DOCUMENTS 8,487,904 B2    7/2013  Mi
2005/0030048 A1*  2/2005  Bolender et al. ............. 324/661

(Continued)

FOREIGN PATENT DOCUMENTS

JP    2008250309    10/2008
JP    2009216978    9/2009

(Continued)

*Primary Examiner* — Stephen Sherman
(74) *Attorney, Agent, or Firm* — Gokalp Bayramoglu

(57) ABSTRACT

A single-layer projected capacitive touch panel has a glass cover, a touch sensing circuit layer, an insulating ink layer, a conductive wire layer, an insulator layer, a conductive glue layer and a flexible printed circuit (FPC) board. The touch sensing circuit layer, the insulating ink layer, the conductive wire layer, the insulator layer and the conductive glue layer are mounted on a circuit surface of the glass cover in sequence. The insulating ink layer covers the touch sensing circuit layer and has multiple through slots. Each through slot is filled with an electric conductor. The FPC is fastened on the conductive wire layer by a conductive glue layer. Therefore, the touch panel of the present invention is thinner, provides better penetrability and costs less than conventional projected capacitive touch panels.

20 Claims, 8 Drawing Sheets

(56) References Cited

U.S. PATENT DOCUMENTS

| | | |
|---|---|---|
| 2005/0046622 A1* | 3/2005 | Nakanishi et al. ............ 345/173 |
| 2005/0156906 A1* | 7/2005 | Chiu et al. ................... 345/173 |
| 2009/0321240 A1 | 12/2009 | Huang et al. |
| 2010/0006347 A1* | 1/2010 | Yang ......................... 178/18.01 |
| 2010/0078231 A1 | 4/2010 | Yeh et al. |
| 2010/0139955 A1 | 6/2010 | Long et al. |
| 2010/0265207 A1 | 10/2010 | Chen et al. |
| 2010/0283755 A1 | 11/2010 | Hsih |
| 2012/0319966 A1 | 12/2012 | Reynolds |

FOREIGN PATENT DOCUMENTS

| | | |
|---|---|---|
| JP | 2011192124 | 9/2011 |
| KR | 1020110110562 | 10/2011 |
| TW | M348999 | 1/2009 |
| TW | M351407 | 2/2009 |
| TW | M355426 | 4/2009 |
| TW | M356623 | 5/2009 |
| TW | 200947278 | 11/2009 |
| TW | M374617 | 2/2010 |
| WO | WO2008047971 | 4/2008 |

* cited by examiner

SINGLE-LAYER PROJECTED CAPACITIVE TOUCH PANEL AND METHOD OF MANUFACTURING THE SAME

This application is a continuation application of Ser. No. 12/661,787, filed Mar. 24, 2010, which is incorporated herein by reference.

BACKGROUND OF THE INVENTION

1. Field of the Invention

The present invention relates to a single-layer projected capacitive touch panel and a method for manufacturing the same, and more particularly to a single-layer projected capacitive touch panel in Which a single glass layer is required, and a method of manufacturing the same.

2. Description of the Related Art

The advancement of touch panel technology has resulted in many consumer electronic products such as personal digital assistant (PDA), global positioning systems (GPS) and the like being equipped with touch panels.

Before iPhone™ was released, resistive touch panels were generally used on small size portable electronic devices because they had sufficiently matured to keep costs low and be reliable. However, resistive touch panels cannot track more than one finger so resistive touch panels cannot resolve multipoint touches. After iPhone™ was announced, projected capacitive touch panels became desirable because it enables multipoint touch.

With reference to FIG. 5, a conventional projected capacitive touch panel comprises a glass base (91), a touch sensing, circuit layer (92), a conductive wire layer (93), an insulator layer (94), a conductive glue layer (95) a flexible printed circuit (FPC) board (96), an optical glue layer (97) and a glass cover (98). The glass base (91) has a circuit surface (911). The touch sensing circuit layer (92) is composed of single-layer touch sensing circuits, and the touch sensing circuit layer (92) and the conductive wire layer (93) are formed on the circuit surface (911) of the glass base (91) and are electronically connected together. The insulator layer (94) is formed on and covers the conductive wire layer (93), and the insulator layer (94) has a breach to partially expose the conductive wire layer (93). The conductive glue layer (95) is formed on the breath of the insulator layer (94) to cover the exposed conductive wire layer (93). The FPC board (96) is adhered to the conductive glue layer (95) and electronically to the conductive wire layer (93) via the conductive glue layer (95). The optical glue layer (97) is formed on the touch sensing circuit layer (92) and the insulator layer (94). The glass cover (98) has an operating surface (981) and an adhering surface (982). The adhering surface (982) of the glass cover (98) is adhered to the optical glue layer (97). The operating surface (981) of the glass cover (98) functions either as a touch surface or a protection cover to protect the touch sensing circuit layer (92), the conductive wire layer (93) and the conductive glue layer (95) on the glass base (91).

Since the conventional projected capacitive touch panel requires two glasses (91, 98), and the two glasses (91, 98) are fixed by the optical glue layer (97), the conventional projected capacitive touch panel has the disadvantages.

1. The optical glue layer (97) is positioned between the glass base (91) and the glass cover (98) so reduces penetrability of the conventional projected capacitive touch panel.

2. Adhering the two glasses (91, 98) requires great accuracy so affecting manufacturing yield rate. Current techniques cannot provide high accuracy of adhering the glasses for increased yield rate of manufacturing the conventional projected capacitive touch panel.

3. The insulator layer (94) and the FPC board (97) may be visible from the operating surface (981) of the glass cover (98) because the optical glue layer (97) is transparent. When installing the conventional projected capacitive touch panel on an electronic device, a casing on the electronic device must be designed to have opaque rims to cover the insulator layer (94) and the FPC board (97). However, such design limitation restricts application and in also requires accurate machining so further raising costs and reducing manufacturing yield.

To overcome the shortcomings, the present invention provides a single-layer projected capacitive touch panel and a method of manufacturing the same to mitigate or obviate the aforementioned problems.

SUMMARY OF THE INVENTION

The main objective of the invention is to provide a projected capacitive touch panel in which a single glass layer is required, and a method of manufacturing the same.

The projected touch panel in accordance with the embodiment of the present invention comprises a glass cover, a touch sensing circuit layer, an insulating ink layer, a conductive wire layer, an insulator layer, a conductive glue layer and a flexible printed circuit (FPC) board. The touch sensing circuit layer, the insulating ink layer, the conductive wire layer, the insulator layer and the conductive glue layer are mounted on a circuit surface of the glass cover in sequence. The insulating ink layer covers edges of the touch sensing circuit layer and has multiple through slots. Each through slot is filled with an electric conductor to electronically connect the conductive wire layer with the touch sensing circuit layer. The FPC is fastened on and electronically connects to the conductive wire layer by a conductive glue layer.

The method in accordance with the embodiment of the present invention comprises steps of:

providing a glass parent board divided into multiple glass covers, and each glass cover having an operating surface and a circuit surface;

forming touch sensing layers respectively on the glass covers, and each touch sensing layer partially formed on the circuit surface of each glass cover, having multiple edges and composed of single-layer touch sensing circuits;

forming insulating ink layers respectively on the touch sensing circuit layers, and each insulating ink layer formed on and near the edges of each touch sensing circuit layer to partially cover the touch sensing circuit layer, and each insulating ink layer having multiple through slots corresponding to and exposing the touch sensing circuit layer covered by the insulating ink layer;

forming electric conductors in the through slots;

forming conductive wire layers respectively on the insulating ink layers to contact with the electric conductors so the conductive wire layers electronically connect respectively to the touch sensing circuit layers via the electric conductors;

forming insulator layers respectively on the conductive wire layers, and each insulator layer having a breach to expose partial conductive wire layer;

separating the glass parent board into multiple glass covers;

installing a FPC board at the breach and on the exposed conductive wire layer on one separated glass cover with a conductive glue layer so the FPC board electronically connects to the conductive wire layer via the conductive glue layer.

Therefore, the touch panel of the embodiment of the present invention is thinner, provides better penetrability and higher yield rate and costs less than conventional projected capacitive touch panels.

Other objectives, advantages and novel features of the invention will become more apparent from the following detailed description when taken in conjunction with the accompanying drawings.

DETAILED DESCRIPTION OF THE EMBODIMENTS

A method of manufacturing a single-layer projected capacitive touch panel in accordance with the present invention comprises steps of providing a glass parent board, forming touch sensing circuit layers, forming insulating ink layers having multiple through slots, forming electric conductors in the through slots, forming conductive wire layers, forming insulator layers, separating the glass parent board into multiple glass covers, installing a flexible printed circuit (FPC) board on one separated glass cover and applying a consolidating glue layer.

Figure 1A:
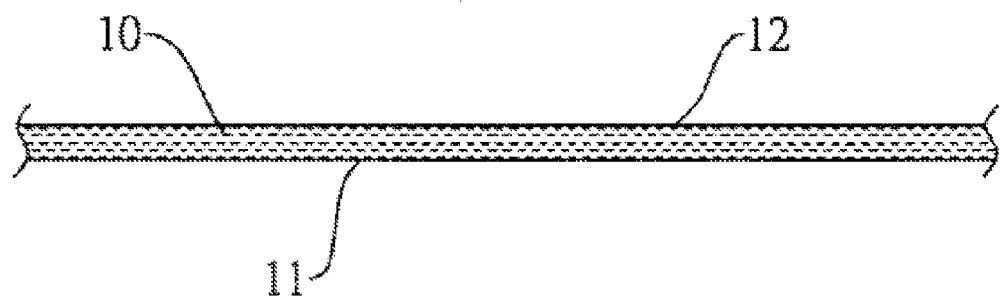
FIGS. 1A to 1H are a series of cross sectional side views showing manufacture of a single-layer projected capacitive touch panel in accordance with the present invention.

With reference to FIG. 1A, in the step of providing a glass parent board, the glass parent board is divided into multiple glass covers (10), and each glass cover (10) has an operating surface (11) and a circuit surface (12).

Figure 1B:
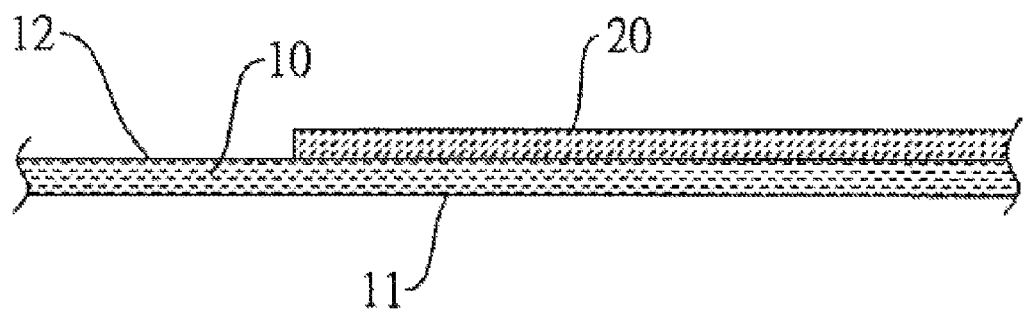
Figure 2:
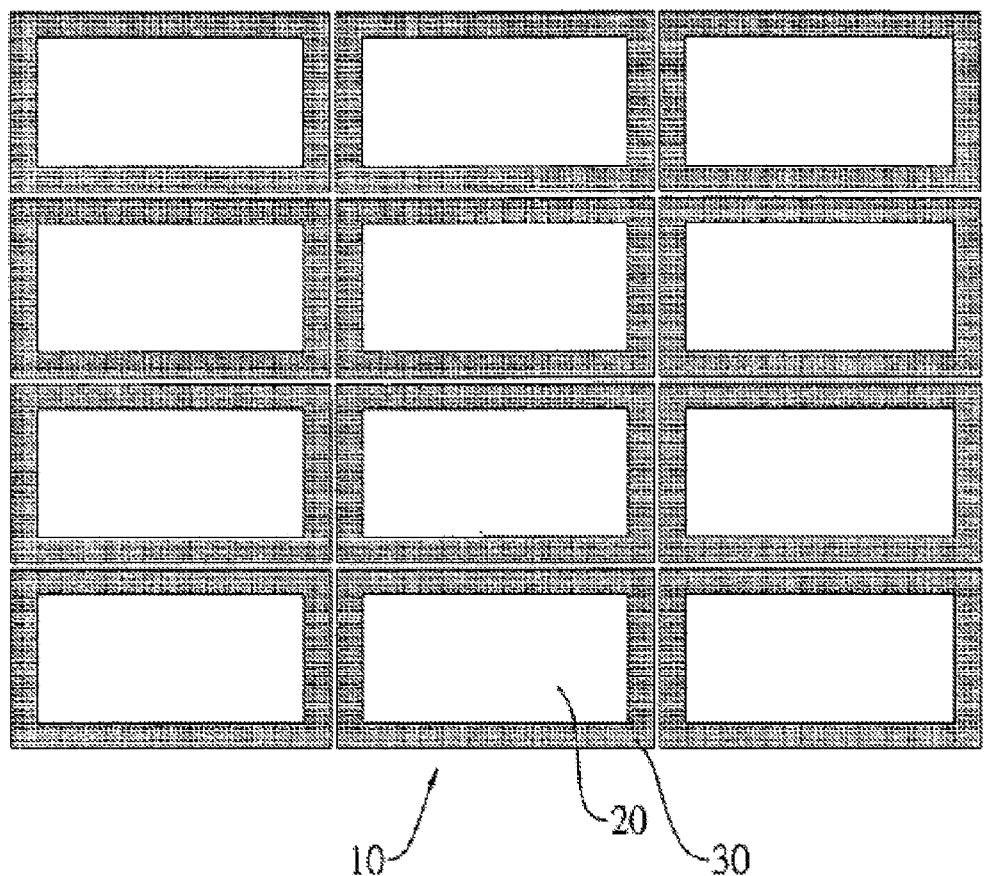
FIG. 2 is a representation of touch sensing circuit layers, insulating ink layers and conductive wire layers on a glass parent board.

With reference to FIG. 1B, in the step of forming touch sensing layers, each touch sensing layer (20) is partially formed on the circuit surface (12) of each glass cover (10) of the glass parent board. With further reference to FIG. 2, each touch sensing layer (20) may be formed on a central zone of the circuit surface (12) of each glass cover (10) and has multiple edges. Further, the touch sensing circuit layer (20) is composed of single-layer touch sensing circuits, such as single-layer indium tin oxide (ITO) circuits.

Figure 1C:
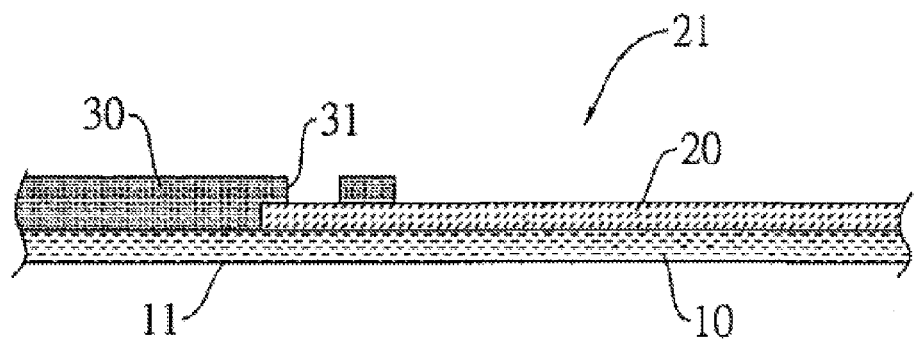

With reference to FIG. 1C and FIG. 2, in the step of forming insulating ink layers having multiple through slots, each insulating ink layer (30) is formed on and near the edges of each touch sensing circuit layer (20) to partially cover the touch sensing circuit layer (20) so defining a touch zone (21) as uncovered areas of the touch sensing circuit layer (20). Further, each insulating ink layer (30) has multiple through slots (31) corresponding to and exposing the touch sensing circuit layer (20) covered by the insulating ink layer (30). In a preferred embodiment, the insulating layer (30) is composed of dark ink, and the insulating layer (30) and through slots (31) thereon are formed on the glass cover (10) and partial touch sensing circuit layer (20) by using screen-printing and curing technique. Consequently, other elements subsequently mounted on the insulating ink layer (30) are invisible when viewed from the operating surface (11) of the glass cover (10).

Figure 1D:
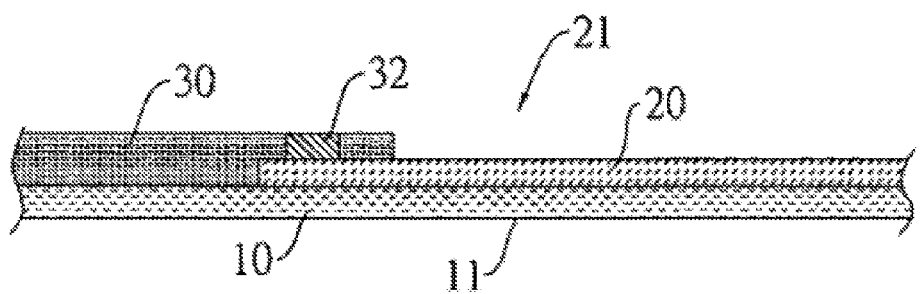

With reference to FIG. 1D, in the step of forming electric conductors in the through slots, the electric conductors (32) are filled respectively in the through slots (31). In a preferred embodiment, color of each electric conductor (32) is similar to the color of the insulating ink layer (30) to avoid people seeing the through slots (32) from the operating side (11) of the glass cover (10).

Figure 1E:
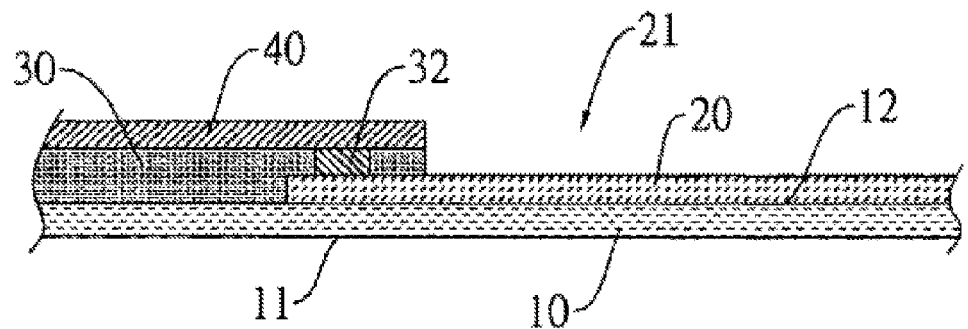

With reference to FIG. 1E, in the step of forming conductive wire layers, the conductive wire layers (40) are formed respectively on the insulating ink layers of the glass covers (10) on the glass parent board to contact with the electric conductors (32). Therefore, the conductive wire layers (40) electronically connect respectively to the touch sensing circuit layers (20) via the electric conductors (32). In a preferred embodiment, the conductive wire layers (40) are made of silver glue by using screen printing technique.

Figure 1F:
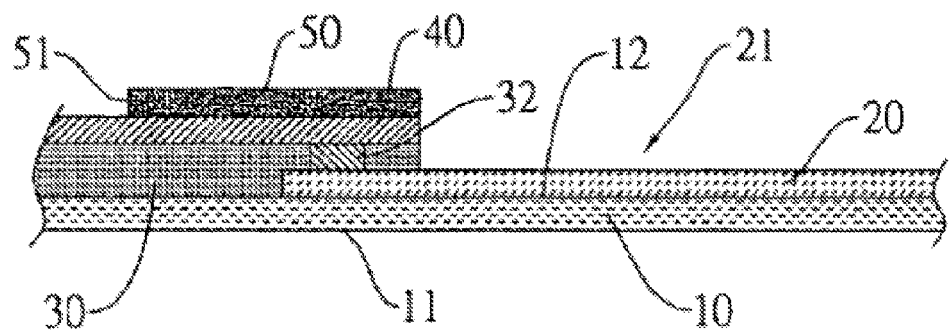

With reference to FIG. 1F, in the step of forming insulator layers, the insulator layers (50) are formed respectively on the conductive wire layers (40) by using screen printing technique to prevent the conductive wire layers (40) from oxidizing. Further, each insulator layer (50) has a breach (51) to expose partial conductive wire layer (40). In a preferred embodiment, the insulator layers (50) are made of transparent material.

In the step of separating the glass parent board into multiple glass covers, the glass parent board is separated into multiple glass covers (10) by a cutting machine.

Figure 1G:
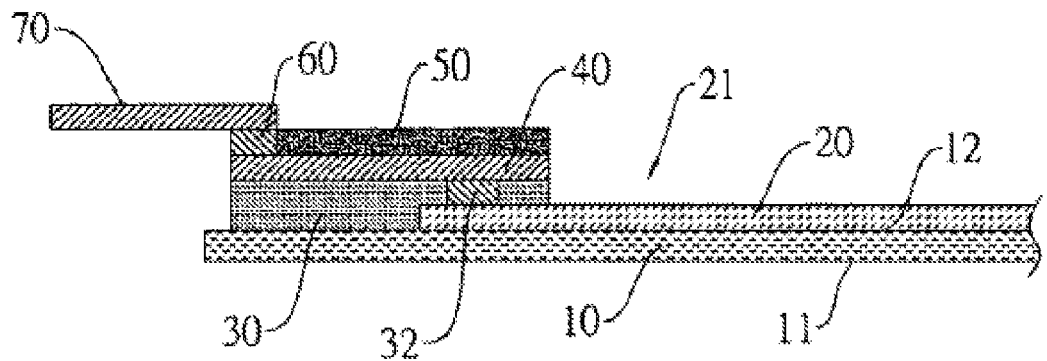
Figure 3:
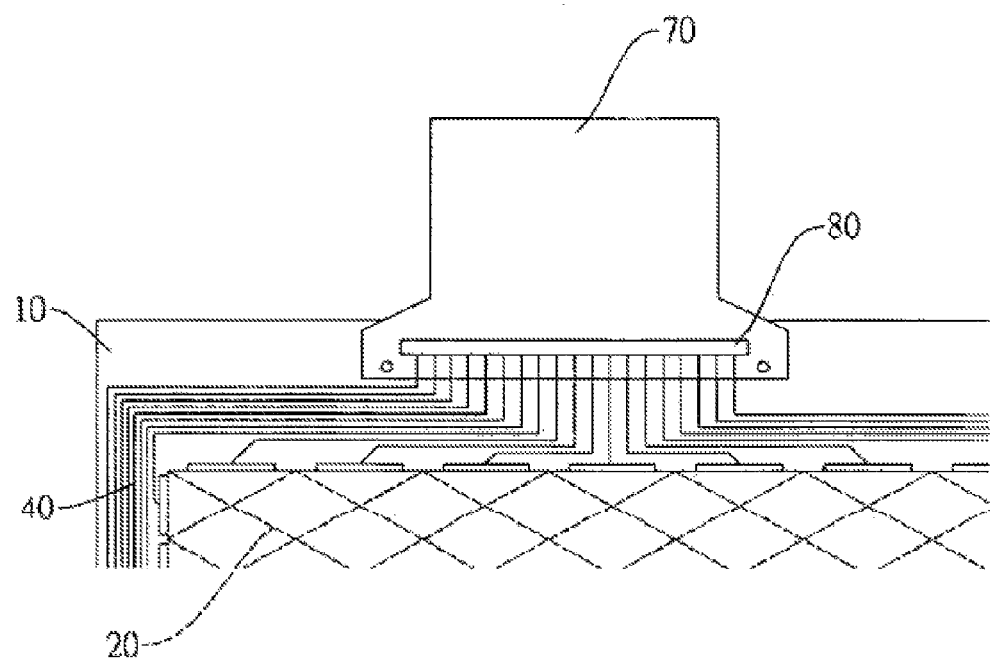
FIG. 3 is a top view of a flexible printed circuit board mounted on a glass cover.

With reference to FIG. 1G and FIG. 3, in the step of installing a FPC board on one separated glass cover, the FPC board (70) is attached to the breach (51) of the insulator layer (50) on the separated glass cover (10) with a conductive glue layer (60). The FPC board (70) is electronically connected to the conductive wire layer (40) exposed through the insulator layer (50) via the conductive glue layer (60). In a preferred embodiment, the conductive glue layer (60) is made of anisotropic conductive film (ACF) or anisotropic conductive paste (ACP), and the FPC board (70) is attached to the exposed conductive wire layer (40) with the conductive glue layer (60) by using a heat seal machine.

Figure 1H:
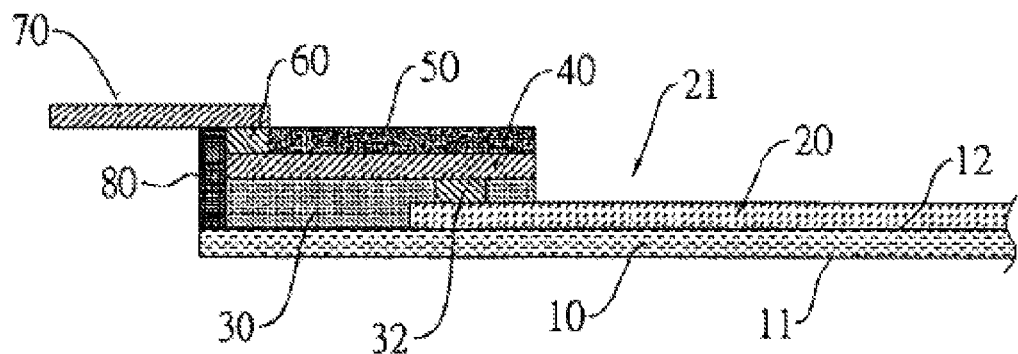

With reference to FIG. 1H, in the step of applying a consolidating glue layer, the consolidating glue layer (80) is applied to the FPC board (70) and the glass cover (10) to enhance fastening the FPC board (70) and prevent the FPC board (70) from coming off during other follow-up manufacturing procedures because of improper installation or dragging.

Figure 4:
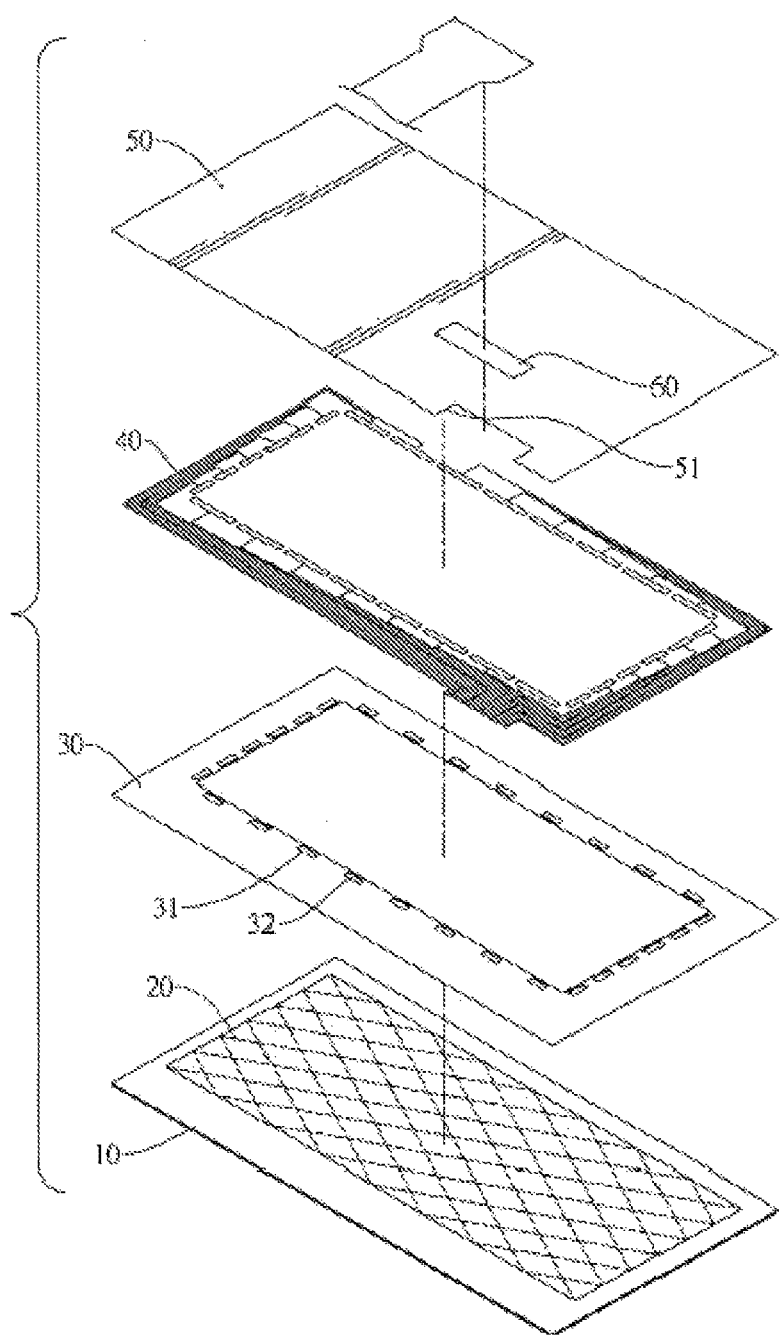
FIG. 4 is an explosive view of the single-layer projected capacitive touch panel in accordance with the present invention.
Figure 5:
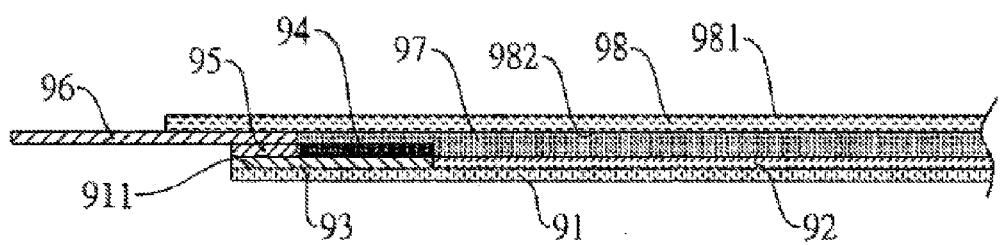
FIG. 5 is a cross sectional view of a conventional projected capacitive touch panel.

Therefore, with further reference to FIG. 4, a single-layer projected capacitive touch panel in accordance with the present invention manufactured by the above-mentioned method comprises a glass cover (10), a touch sensing circuit layer (20), an insulating ink layer (30), a conductive wire layer (40), an insulator layer (50), a conductive glue layer (60), a FPC board (70) and a consolidating glue layer (80).

The glass cover (10) has an operating surface (11) and a circuit surface (11). The operating surface (11) is for users to touch.

The touch sensing circuit layer (20) is mounted on the circuit surface (12) of the glass cover (10) and has multiple edges.

The insulating ink layer (30) is formed on and covers the edges of the touch sensing circuit layer (20), and the uncovered touch sensing circuit layer (20) is defined as a touch zone (21). The insulating ink layer (30) further has multiple through slots (31). The through slots (31) correspond to and expose the touch sensing circuit layer (20) covered by the insulating ink layer (30), and each through slot (31) is filled with an electric conductor (32).

The conductive wire layer (40) is formed on and covers the insulating ink layer (30) so the conductive wire layer (40) electronically connects to the touch sensing circuit layer (30) via the electric conductors (32) in the through slots (31).

The insulator layer (50) is formed on and covers the conductive wire layer (40) and has a breach (51). The breach (51) exposes the partial conductive wire layer (40).

The conductive glue layer (60) is mounted on the breach (51) of the insulator layer (50) to cover the exposed conductive wire layer (40).

The FPC board (70) is attached to the conductive glue layer (60) to be mounted on the breach (51) of the insulator layer (50) and electronically connects to the conductive wire layer (40) via the conductive glue layer (60).

The consolidating glue layer (80) is applied to and between the FPC board (70) and the glass cover (10).

The projected capacitive touch panel in accordance with the embodiments of the present invention has advantages in the following.

1. Because the touch panel of the present invention only requires a single glass and the required optical glue layer in the conventional projected capacitive touch panel is unnecessary in the touch panel of the present invention, the touch panel of the embodiment of the present invention is indeed thinner than the conventional projected capacitive touch panel. Further, the touch panel of the embodiment of the present invention also provides better penetrability than the conventional projected capacitive touch panel.

2. The touch panel of the embodiment of the present invention does not need to adhere two glasses so the procedure of adhering glasses is not required and the cost for manufacturing the touch panel of the embodiment of the present invention is reduced. Further, manufacturing yield of the touch panel of the embodiment of the present invention is better than conventional projected capacitive touch panels. In addition, manufacturing costs of the touch of the embodiment of the present invention are also reduced because the touch panel of the embodiment of the present invention only requires a single glass.

3. Because the conductive wire layer (40), the insulator layer (50) and the conductive glue layer (60) are subsequently mounted on the insulating ink layer (30), they are hidden by the insulating ink layer (30) when viewed from the operating surface (11) of the glass cover (10). Therefore, it is convenient for designers to design a casing on an electronic device without rims to cover the conductive wire layer (40), the insulator layer (50) and the conductive glue layer (60) in the touch panel of the embodiment of the present invention.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A projected capacitive touch panel, comprising:
   a glass cover having an operating surface and a circuit surface;
   a touch sensing circuit layer formed on the circuit surface;
   an insulating ink layer partially covering the touch sensing circuit layer, wherein the covered area of the touch sensing circuit layer is defined as multiple edge zones, the uncovered area of the touch sensing circuit layer is defined as a touch sensing zone, wherein the insulating ink layer has multiple through slots on the edge zones such that the through slots correspond to and expose the touch sensing circuit layer, wherein each through slot has an electric conductor therein; and
   a conductive wire layer formed on the insulating ink layer and electrically connecting the touch sensing circuit layer via the electric conductors.

2. The projected capacitive touch panel of claim 1, further comprising an insulator layer formed on the conductive wire layer, wherein the insulator layer has a breach to partially expose the conductive wire layer.

3. The projected capacitive touch panel of claim 2, further comprising a conductive glue layer corresponding to the breach to cover the exposed conductive wire layer.

4. The projected capacitive touch panel of claim 3, further comprising a flexible printed circuit (FPC) board attached to the conductive glue layer and electrically connecting the conductive wire layer via the conductive glue layer.

5. The projected capacitive touch panel of claim 4, further comprising a consolidating glue layer formed between the FPC board and the glass cover.

6. The projected capacitive touch panel of claim 5, wherein the consolidating glue layer is located along the outer periphery of the insulating ink layer.

7. The projected capacitive touch panel of claim 3, wherein the conductive glue layer is made of anisotropic conductive film (ACF) or anisotropic conductive paste (ACP).

8. The projected capacitive touch panel of claim 4, further comprising a fastening member disposed under the FPC board, wherein the fastening member attaches to an outer surface of the conductive glue layer, an outer surface of the conductive wire layer and an outer surface of the insulating ink layer.

9. The projected capacitive touch panel of claim 1, wherein color of each electric conductor is similar to color of the insulating ink layer.

10. The projected capacitive touch panel of claim 1, wherein the insulating ink layer is made of dark ink.

11. The projected capacitive touch panel of claim 1, wherein the conductive wire layer is made of silver glue.

12. The projected capacitive touch panel of claim 1, wherein the insulating ink layer has a ring shape, and wherein the through slots are arranged on the inner periphery of the insulating ink layer.

13. A method of manufacturing a projected capacitive touch panel comprising steps of:
   providing a glass cover having an operating surface and a circuit surface;
   forming a touch sensing circuit layer on the circuit surface of the glass cover;
   forming an insulating ink layer on the touch sensing circuit layer, wherein the insulating ink layer partially covers the touch sensing circuit layer, the covered area of the touch sensing circuit layer is defined as multiple edge zones, the uncovered area of the touch sensing circuit layer is defined as a touch sensing zone, and wherein the insulating ink layer has multiple through slots on the edge zones correspond to and expose the touch sensing circuit layer;
   forming electric conductors into the through slots; and
   forming a conductive wire layer on the insulating ink layer to contact with the electric conductors, thereby electrically connecting the touch sensing circuit layer via the electric conductors.

14. The method of claim 13 further comprising a step of forming an insulator layer with a breach on the conductive wire layer, wherein the conductive wire layer is partially exposed through the breach.

15. The method of claim 14 further comprising a step of mounting a flexible printed circuit (FPC) board on the exposed conductive wire layer with a conductive glue layer, such that the FPC board electrically connects to the conductive wire layer via the conductive glue layer.

16. The method of claim 15 further comprising a step of applying a consolidating glue layer to and between the FPC board and the glass cover after the step of installing the FPC board.

17. The method of claim 14, wherein the insulator layer is formed by using a screen printing method.

18. A projected capacitive touch panel, comprising:
- a glass cover having a first surface and a second surface;
- a touch sensing circuit layer formed on the second surface;
- an insulating ink layer partially covering the touch sensing circuit layer, wherein the covered area of the touch sensing circuit layer is defined as multiple edge zones, the uncovered area of the touch sensing circuit layer is defined as a touch sensing zone, wherein the insulating ink layer has multiple through slots on the edge zones such that the through slots correspond to and expose the touch sensing circuit layer, wherein each through slot has an electric conductor therein; and
- a conductive wire layer formed on the insulating ink layer such that the conductive wire layer is invisible upon viewing through the insulating ink layer from the first surface of the glass cover, wherein the conductive wire layer electrically connects the touch sensing circuit layer via the electric conductors.

19. The projected capacitive touch panel of claim 18, wherein color of each electric conductor is similar to color of the insulating ink layer.

20. The projected capacitive touch panel of claim 18, wherein the insulating ink layer is made of dark ink.

\* \* \* \* \*